United States Patent
Goto et al.

(10) Patent No.: US 12,503,450 B2
(45) Date of Patent: Dec. 23, 2025

(54) COMPOSITION, OPTICALLY ANISOTROPIC FILM, OPTICAL FILM, CIRCULARLY POLARIZING PLATE, AND ORGANIC ELECTROLUMINESCENT DISPLAY DEVICE

(71) Applicant: FUJIFILM Corporation, Tokyo (JP)

(72) Inventors: Ryoji Goto, Kanagawa (JP); Ryoji Himeno, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 929 days.

(21) Appl. No.: 17/701,179

(22) Filed: Mar. 22, 2022

(65) Prior Publication Data

US 2022/0213044 A1    Jul. 7, 2022

Related U.S. Application Data (63) Continuation of application No. PCT/JP2020/035901, filed on Sep. 24, 2020.

(30) Foreign Application Priority Data

Sep. 27, 2019   (JP) ................................ 2019-176348

(51) Int. Cl.
| | | |
|---|---|---|
| C07D 251/24 | (2006.01) | |
| C08L 79/08 | (2006.01) | |
| C08L 101/12 | (2006.01) | |
| G02B 5/30 | (2006.01) | |
| H10K 59/80 | (2023.01) | |
| H10K 85/60 | (2023.01) | |

(52) U.S. Cl.
CPC ............ *C07D 251/24* (2013.01); *C08L 79/08* (2013.01); *C08L 101/12* (2013.01); *G02B 5/30* (2013.01);

(Continued)

(58) Field of Classification Search
CPC ..... C08L 79/08; C08L 101/12; C07D 251/24; H10K 59/8793
See application file for complete search history.

(56) References Cited

U.S. PATENT DOCUMENTS

| | | |
|---|---|---|
| 6,583,284 B1 | 6/2003 | Sidorenko et al. |
| 2007/0153178 A1 | 7/2007 | Rao et al. |

(Continued)

FOREIGN PATENT DOCUMENTS

| | | | |
|---|---|---|---|
| JP | 2002296415 A | * | 10/2002 |
| JP | 2009-520239 A | | 5/2009 |

(Continued)

OTHER PUBLICATIONS

Machine-generated English-language translation of JP-2015200754-A.*

(Continued)

*Primary Examiner* — Vu A Nguyen
(74) *Attorney, Agent, or Firm* — Edwards Neils LLC; Jean C. Edwards, Esq.

(57) ABSTRACT

Provided is a composition with which an optically anisotropic film exhibits reverse wavelength dispersibility and shows nx>nz>ny can be formed, an optically anisotropic film, an optical film, a circularly polarizing plate, and an organic EL display device. The composition includes a compound represented by Formula (1); and a rod-like compound, in which the compound represented by Formula (1) has a maximal absorption wavelength in a wavelength range of 300 nm or less, and the rod-like compound has a maximal absorption wavelength in a wavelength range of 330 nm or more.

(Continued)

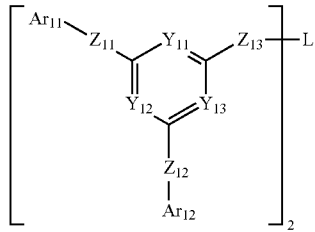

(1)

14 Claims, 1 Drawing Sheet

(52) U.S. Cl.
CPC ....... *H10K 85/654* (2023.02); *H10K 59/8791* (2023.02)

(56) References Cited

U.S. PATENT DOCUMENTS

| | | | |
|---|---|---|---|
| 2010/0085521 A1 | 4/2010 | Kasianova et al. | |
| 2011/0272629 A1 | 11/2011 | Shin et al. | |
| 2012/0099052 A1 | 4/2012 | Lazarev | |
| 2020/0174171 A1 | 6/2020 | Nishikawa et al. | |

FOREIGN PATENT DOCUMENTS

| | | | |
|---|---|---|---|
| JP | 2012-500316 A | | 1/2012 |
| JP | 2012-507619 A | | 3/2012 |
| JP | 2013-166809 A | | 8/2013 |
| JP | 2013-543148 A | | 11/2013 |
| JP | 2015200754 A | * | 11/2015 |
| WO | 2019/044859 A1 | | 3/2019 |

OTHER PUBLICATIONS

Machine-generated English-language translation of JP-2002296415-A.*
Nakatsuji et al., J. Chem. Soc. Perkin Trans. 1, 1992, 755-758.*
Office Action, which was issued by the Japanese Patent Office on Oct. 31, 2023, in connection with Japanese Patent Application No. 2021-548948.
International Search Report issued in PCT/JP2020/035901 on Dec. 8, 2020.
Written Opinion issued in PCT/JP2020/035901 on Dec. 8, 2020.
International Preliminary Report on Patentability completed by WIPO on Mar. 15, 2022 in connection with International Patent Application No. PCT/JP2020/035901.
Office Action, which was issued by the Japanese Patent Office on Mar. 22, 2023, in connection with Japanese Patent Application No. 2021-548948.

* cited by examiner

COMPOSITION, OPTICALLY ANISOTROPIC FILM, OPTICAL FILM, CIRCULARLY POLARIZING PLATE, AND ORGANIC ELECTROLUMINESCENT DISPLAY DEVICE

CROSS-REFERENCE TO RELATED APPLICATIONS

This application is a Continuation of PCT International Application No. PCT/JP2020/035901 filed on Sep. 24, 2020, which was published under PCT Article 21(2) in Japanese, and which claims priority under 35 U.S.C. § 119(a) to Japanese Patent Application No. 2019-176348 filed on Sep. 27, 2019. The above applications are hereby expressly incorporated by reference, in their entirety, into the present application.

BACKGROUND OF THE INVENTION

1. Field of the Invention

The present invention relates to a composition, an optically anisotropic film, an optical film, a circularly polarizing plate, and an organic electroluminescent display device.

2. Description of the Related Art

A phase difference film having refractive index anisotropy (optically anisotropic film) has been applied to various uses such as an antireflection film of a display device, and an optical compensation film of a liquid crystal display device.

For example, JP2012-500316A proposes a biaxial optically anisotropic film formed by using a composition exhibiting a lyotropic liquid crystallinity. Here, the expression "biaxial" means that a refractive index nx in a slow axis direction, a refractive index ny in a fast axis direction, and a refractive index nz in a thickness direction of the optically anisotropic film satisfy a relationship of nx>nz>ny.

SUMMARY OF THE INVENTION

On the other hand, in recent years, it has been required to exhibit reverse wavelength dispersibility with respect to an optically anisotropic film.

The present inventors examined characteristics of the biaxial optically anisotropic film described in JP2012-500316A, but the reverse wavelength dispersibility was not exhibited and further improvement was required. In particular, it has been desired to exhibit the reverse wavelength dispersibility in a visible light region.

An object of the present invention is to provide a composition with which an optically anisotropic film exhibiting reverse wavelength dispersibility and showing nx>nz>ny can be formed.

In addition, another object of the present invention is to provide an optically anisotropic film, an optical film, a circularly polarizing plate, and an organic EL display device.

The present inventors have conducted intensive studies on problems in the related art, and as a result, have found that the objects can be achieved by the following configurations.

(1) A composition comprising:
  a compound represented by Formula (1) which will be described later; and
  a rod-like compound,
  in which the compound represented by Formula (1) has a maximal absorption wavelength in a wavelength range of 300 nm or less, and
  the rod-like compound has a maximal absorption wavelength in a wavelength range of 330 nm or more,
(2) The composition according to (1),
  in which the rod-like compound contains at least one selected from the group consisting of a polymer having a repeating unit represented by Formula (2) which will be described later and a polymer having a repeating unit represented by Formula (3) which will be described later.
(3) The composition according to (1) or (2),
  in which at least one of the compound represented by Formula (1) or the rod-like compound has a polymerizable group.
(4) The composition according to any one of (1) to (3),
  in which a content of the compound represented by Formula (1) with respect to total mass of the compound represented by Formula (1) and the rod-like compound is more than 50% by mass.
(5) The composition according to any one of (1) to (4), further comprising:
  a near infrared absorbing compound having a maximal absorption wavelength in a wavelength range of 700 to 1,000 nm.
(6) The composition according to any one of (1) to (5), further comprising:
  a polymerizable monomer.
(7) The composition according to any one of (1) to (6), further comprising:
  a compound represented by Formula (4) which will be described later.
(8) The composition according to any one of (1) to (7), further comprising:
  a solvent.
(9) An optically anisotropic film formed of the composition according to any one of (1) to (8).
(10) An optical film comprising:
  a substrate; and
  the optically anisotropic film according to (9).
(11) The optical film according to (10), further comprising:
  an alignment film arranged between the substrate and the optically anisotropic film.
(12) A circularly polarizing plate comprising:
  the optically anisotropic film according to (9) or the optical film according to (10) or (11); and
  a polarizer.
(13) The circularly polarizing plate according to (12),
  in which an angle formed by a slow axis of the optically anisotropic film or a slow axis of the optically anisotropic film in the optical film and an absorption axis of the polarizer is within a range of 45°±5°.
(14) An organic electroluminescent display device comprising:
  an organic electroluminescence display element having a substrate, a metal electrode layer, a light emitting layer consisting of an organic material, and a transparent electrode layer;
  the circularly polarizing plate according to (12) or (13),
  in which the optically anisotropic film in the circularly polarizing plate is arranged closer to the organic electroluminescence display element than the polarizer, and
  a total value of a thickness-direction retardation of all members existing between the metal electrode layer and the polarizer at a wavelength of 550 nm is within 0±30 nm.

According to the present invention, it is possible to provide a composition with which an optically anisotropic film exhibiting reverse wavelength dispersibility and showing nx>nz>ny can be formed.

In addition, according to the present invention, it is possible to provide an optically anisotropic film, an optical film, a circularly polarizing plate, and an organic EL display device.

DESCRIPTION OF THE PREFERRED EMBODIMENTS

Hereinafter, the present invention will be described in detail.

Furthermore, in the present specification, a numerical range expressed using "to" means a range that includes the preceding and succeeding numerical values of "to" as the lower limit value and the upper limit value, respectively.

In addition, a fast axis and a slow axis are each defined at a wavelength of 550 nm unless otherwise specified. That is, unless otherwise specified, for example, the fast axis direction means a direction of the fast axis at a wavelength of 550 nm.

In the present invention, $Re(\lambda)$ and $Rth(\lambda)$ represent an in-plane retardation and a thickness-direction retardation at a wavelength of $\lambda$, respectively. The wavelength of $\lambda$ refers to 550 nm unless otherwise specified.

In the present invention, $Re(\lambda)$ and $Rth(\lambda)$ are values measured at a wavelength of $\lambda$ in AxoScan OPMF-1 (manufactured by Opto Science, Inc.). By inputting an average refractive index ((nx+ny+nz)/3) and a film thickness (d (μm)) to AxoScan, the values can be calculated:
Slow axis direction (°)

$$Re(\lambda)=R0(\lambda)$$

$$Rth(\lambda)=((nx+ny)/2-nz)\times d.$$

Furthermore, $R0(\lambda)$ is expressed in a numerical value calculated with AxoScan OPMF-1, but means $Re(\lambda)$.

In the present specification, the refractive indices, nx, ny, and nz are measured with an Abbe refractometer (NAR-4T, manufactured by Atago Co., Ltd.), using a sodium lamp ($\lambda$=589 nm) as a light source. In addition, in a case where a wavelength dependency is measured, the wavelength dependency can be measured with a multi-wavelength Abbe refractometer DR-M2 (manufactured by Atago Co., Ltd.) in combination with an interference filter.

Moreover, the values mentioned in Polymer Handbook (JOHN WILEY & SONS, INC.) and the catalogues of various optical films can be used. The values of the average refractive indices of major optical films are exemplified below: cellulose acylate (1.48), cycloolefin polymer (1.52), polycarbonate (1.59), polymethyl methacrylate (1.49), and polystyrene (1.59).

Further, in the present specification, an Nz factor is a value given by Nz=(nx−nz)/(nx−ny).

Moreover, in the present specification, "visible rays" are intended to mean a light at a wavelength of 400 nm or more and less than 700 nm. In addition, "ultraviolet rays" are intended to mean a light at a wavelength of 10 nm or more and less than 400 nm.

In addition, in the present specification, an angle relationship (for example, such as "perpendicular" and "parallel") include a range of errors allowable in the technical field to which the present invention belongs. For example, the range means that the angle is within a range of ±5° of a rigorous angle, and an error from the rigorous angle is preferably within a range of ±3°.

The bonding direction of a divalent group (for example, —COO—) as noted in the present specification is not particularly limited, and for example, in a case where L in X-L-Y is —COO—, and *1 represents a bonding position to an X side and *2 represents a bonding position to a Y side, L may be either *1-O—CO—*2 or *1-CO—O—*2.

One of feature points of the composition according to the embodiment of the present invention may be that two kinds of the compound exhibiting a predetermined absorption characteristics are used.

Figure 1:
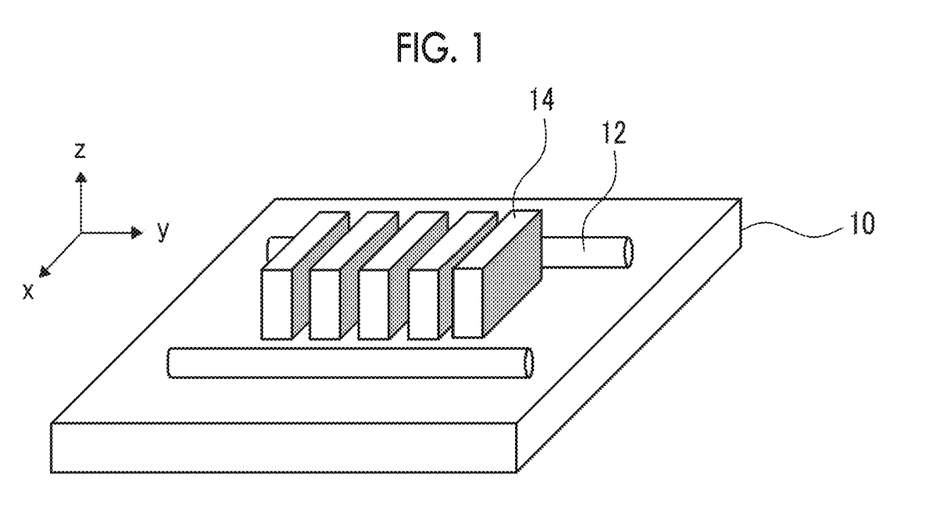
FIG. 1 is a schematic view for explaining a structure of an optically anisotropic film according to an embodiment of the present invention.

The composition according to the embodiment of the present invention is a lyotropic liquid crystalline composition as described later, and in a case of forming an optically anisotropic film, an alignment state is formed along a predetermined shearing direction. Specifically, as shown in FIG. 1, in a case where the composition is applied along a y-axis direction, a molecular axis of a rod-like compound 12 (a direction in which the rod-like compound 12 extends) on the substrate 10 is arranged along the y-axis direction. In addition, a compound represented by Formula (1) (hereinafter, also simply referred to as a "specific compound") 14 has a cyclic structure inside thereof and has a flat structure as a whole. Therefore, as shown in FIG. 1, the plurality of specific compounds 14 are arranged so that surfaces of the flat structure face each other (in other words, cyclic structures inside the compound face each other). Moreover, a columnar association formed by associating the specific compounds 14 with each other is arranged such that an extending direction of the association is along the molecular axis of the rod-like compound 12.

In such an alignment state, due to a structure derived from the specific compound 14, an x-axis direction in FIG. 1 becomes a slow axis, and a refractive index nx in a slow axis direction of the optically anisotropic film and a refractive index ny in the fast axis direction and a refractive index nz in a thickness direction thereof satisfy a relationship of nx>nz>ny.

Figure 2:
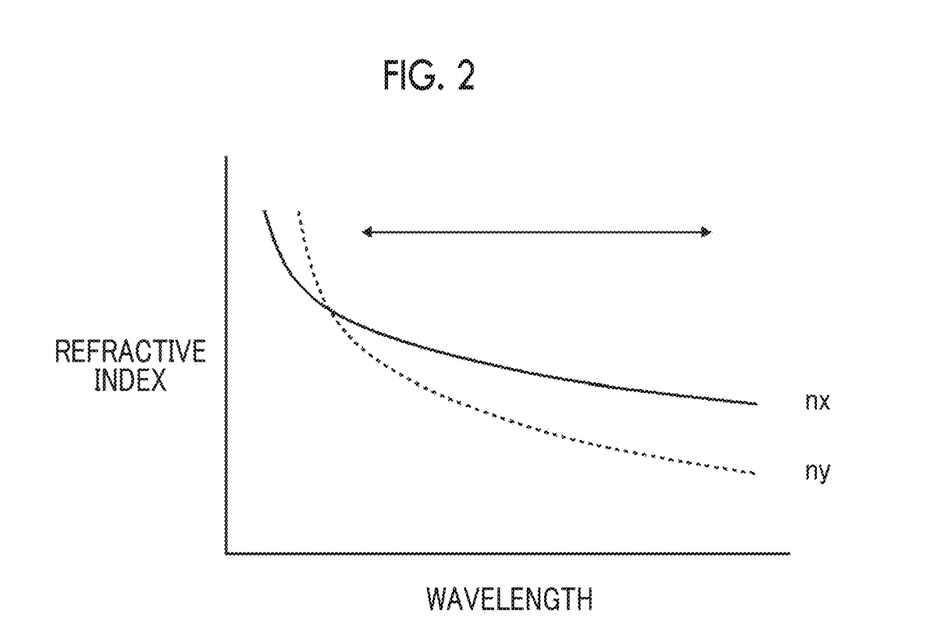
FIG. 2 is a view showing a comparison of a wavelength dispersion between an extraordinary ray refractive index ne and an ordinary ray refractive index no of the optically anisotropic film according to an embodiment of the present invention exhibiting reverse wavelength dispersibility.

Further, in the present invention, the specific compound has a maximal absorption wavelength in a wavelength range of 300 nm or less, and the rod-like compound has a maximal absorption wavelength in a wavelength range of 330 nm or more. That is, the specific compound has absorption on a shorter wavelength side, and the rod-like compound has absorption on a longer wavelength side. As shown in FIG. 1, the specific compounds 14 are arranged such that the absorption axes thereof are along the x-axis direction, and the rod-like compound 12 are arranged such that the absorption axes thereof are along the y-axis direction. Therefore, as shown in FIG. 2, since nx decreases earlier than ny, and nx decreases more slowly than ny in a region indicated by the arrow (particularly, a visible light region), the reverse wavelength dispersibility is achieved.

Next, a configuration of the composition according to the embodiment of the present invention (hereinafter, also simply referred to as a "composition") will be described in detail.

The composition comprises a specific compound and a rod-like compound.

In the following, first, materials comprised in the composition will be described in detail, and then an optically anisotropic film formed by using the composition will be described in detail.

<Compound Represented by Formula (1)>

The composition comprises a specific compound. As described above, the specific compound has a ring structure defined in Formula (1) and corresponds to a flat compound having a flat molecular structure. Therefore, as described above, it is easy to form the association by packing the specific compounds so that the ring structures face each other.

The "flat compound" indicates a compound having a structure in which an aromatic ring (such as an aromatic hydrocarbon ring and an aromatic heterocyclic ring) extends two-dimensionally via a single bond or an appropriate linking group, and a compound group having a property of forming a columnar association by associating planes in a compound with each other in a solvent.

The specific compound preferably exhibits lyotropic liquid crystallinity. The lyotropic liquid crystallinity refers to a property of causing a phase transition between an isotropic phase and a liquid crystal phase by changing a temperature or a concentration in a solution state dissolved in a solvent.

The specific compound is preferably water-soluble from a viewpoint that it is easy to control the expression of liquid crystallinity. The water-soluble specific compound represents a specific compound that dissolves in 1% by mass or more in water, and preferably a specific compound that dissolves in 5% by mass or more in water.

The specific compound has a maximal absorption wavelength in a wavelength range of 300 nm or less. That is, the specific compound has a maximal absorption peak in the wavelength range of 300 nm or less.

The maximal absorption wavelength means a wavelength at which an absorbance of the specific compound takes a maximal value in an absorption spectrum (measurement range: wavelength range of 250 to 700 nm) thereof. In a case where there are a plurality of maximal values in the absorbance of the absorption spectrum of the specific compound, a wavelength of the maximal value with the highest absorbance is selected.

Among these, the specific compound preferably has a maximal absorption wavelength in a range of 250 to 300 nm and more preferably has a maximal absorption wavelength in a range of 260 to 290 nm, from a viewpoint that at least one effect (hereinafter, simply referred to as a "viewpoint that the effect of the present invention is excellent") that the reverse wavelength dispersibility of the optically anisotropic film to be obtained is more excellent or a relationship of nx, ny, and nz of the optically anisotropic film is easy to control can be obtained.

A measuring method of the maximal absorption wavelength is as follows.

The specific compound (0.01 to 0.05 mmol) is dissolved in pure water (1,000 ml), and the absorption spectrum of the obtained solution is measured using a spectrophotometer (MPC-3100 (manufactured by SHIMADZU)).

In the formula, $Ar_{11}$ and $Ar_{12}$ each independently represent a monovalent aromatic ring which may have a substituent.

The monovalent aromatic ring may be either a monocyclic ring or a polycyclic ring.

Examples of the monovalent aromatic ring include a monovalent aromatic hydrocarbon ring and a monovalent aromatic heterocyclic ring. Examples of the monovalent aromatic hydrocarbon ring include a group obtained by excluding one hydrogen atom directly bonded to an aromatic hydrocarbon ring such as a benzene ring, a naphthalene ring, an anthracene ring, and a phenanthroline ring. Examples of the monovalent aromatic heterocyclic ring include a group obtained by excluding one hydrogen atom directly bonded to an aromatic heterocyclic ring such as a furan ring, a pyrrole ring, a thiophene ring, a pyridine ring, a thiazole ring, and a benzothiazole ring.

The substituent which may have a monovalent aromatic ring is not particularly limited, and examples thereof include an alkyl group, an alkenyl group, an alkynyl group, an aryl group, an amino group, a dialkylamino group, a monoalkylamino group, an alkoxy group, an aryloxy group, an aromatic heterocyclic oxy group, an acyl group, an alkoxycarbonyl group, an aryloxycarbonyl group, an acyloxy group, an acylamino group, an alkoxycarbonylamino group, an aryloxycarbonylamino group, a sulfonylamino group, a sulfamoyl group, a carbamoyl group, an alkylthio group, an arylthio group, an aromatic heterocyclic thio group, a sulfonyl group, a sulfinyl group, a ureide group, a phosphoric acid amide group, a hydroxy group, a mercapto group, a halogen atom, a cyano group, a sulfo group or a salt thereof, a carboxyl group or a salt thereof, a nitro group, a hydroxamic acid group, a sulfino group, a hydrazino group, an imino group, a heterocyclic group (for example, a heteroaryl group), a silyl group, and a group formed by combination of these groups. Further, the substituent may further be substituted with a substituent.

It is preferable that at least one of $Ar_{11}$ or $Ar_{12}$ has a substituent. As the substituent, a sulfo group ($-SO_3H$) or a salt thereof, a carboxyl group or a salt thereof, or a group having a hydroxy group is preferable, and a sulfo group or a salt thereof or a group having a hydroxy group is more preferable, from the viewpoint that the effect of the present invention is excellent.

As cation ions in the salt of the sulfo group, $Na^+$, $K^+$, $Li^+$, $Rb^+$, $Cs^+$, $Ba^{2+}$, $Ca^{2+}$, $Mg^{2+}$, $Sr^{2+}$, $Pb^{2+}$, $Zn^{2+}$, $La^{3+}$, $Ce^{3+}$, $Y^{3+}$, $Yb^{3+}$, $Gd^{3+}$, $Zr^{4+}$, or $NH_{4-k}Q_k^+$ (Q represents a linear or branched alkyl group having 1 to 20 carbon atoms, an alkenyl group, an alkynyl group, an aryl group having 6 to 20 carbon atoms, and k represents an integer of 1 to 4) is preferable, and $Na^+$, $K^+$, $Li^+$, $Cs^+$, $Rb^+$, $Ba^{2+}$, $Ca^{2+}$, $Mg^{2+}$, or $NH_{4-k}Q_k^+$ is more preferable.

As the cation ions, an alkali metal ion is still more preferable.

The group having a hydroxy group is not particularly limited, as long as the group contains a hydroxy group, and examples thereof include a hydroxy group, an alkyl group substituted with a hydroxy group, a dialkylamino group having an alkyl group substituted with a hydroxy group, and a monoalkylamino group having an alkyl group substituted with a hydroxy group.

$Z_{11}$, $Z_{12}$, and $Z_3$ each independently represent a single bond, —NH—, or —O—. Among these, —NH— is preferable from the viewpoint that the effect of the present invention is more excellent.

$Y_{11}$, $Y_{12}$, and $Y_{13}$ each independently represent —CH= or —N=. Among these, —N= is preferable from the viewpoint that the effect of the present invention is more excellent.

L represents a divalent linking group. Examples of the divalent linking group include a divalent hydrocarbon group (for example, a divalent aliphatic hydrocarbon group such as an alkylene group, an alkenylene group, and an alkynylene group, and a divalent aromatic hydrocarbon group such as an arylene group), a divalent heterocyclic group, —O—, —S—, —NH—, —N(Q)-, —CO—, —CH=N—, —N=N—, or a group formed by combination of these groups (for example, —O-divalent hydrocarbon group-, —(O-divalent hydrocarbon group)$_m$-O— (m represents an integer of 1 or more), and -divalent hydrocarbon group-O—CO—). Q represents a hydrogen atom or an alkyl group.

As L, a group represented by Formula (X) is preferable.

Formula (X)

$L_1$ and $L_3$ each independently represent a single bond or an alkylene group having 1 to 6 carbon atoms (preferably an alkylene group having 1 to 4 carbon atoms). $L_2$ represents a single bond, an alkylene group having 1 to 6 carbon atoms (preferably an alkylene group having 1 to 4 carbon atoms), —O—, —S—, or —NH—. $Ar_1$ and $Ar_2$ each independently represent a phenylene group or a naphthylene group. n represents 0 or 1.

The specific compound may have a polymerizable group. A type of the polymerizable group is not particularly limited, and a radically polymerizable group or a cationically polymerizable group is preferable.

A known radically polymerizable group can be used as the radically polymerizable group, and an acryloyl group, a methacryloyl group, or a styryl group is preferable.

A known cationically polymerizable group can be used as the cationically polymerizable group, and specific examples thereof include an alicyclic ether group, a cyclic acetal group, a cyclic lactone group, a cyclic thioether group, a spiroorthoester group, and a vinyloxy group. Among those, the alicyclic ether group or the vinyloxy group is preferable, and the epoxy group, the oxetanyl group, or the vinyloxy group is more preferable.

In particular, preferred examples of the polymerizable group include the following groups.

Examples of the specific compound include the followings.

II-1-1

II-1-2

II-2-1

II-2-2

II-2-3

II-3-1

II-3-2

-continued

II-4-1

II-4-2

II-5-1

II-5-2

<Rod-Like Compound>

The composition comprises a rod-like compound. As described above, the rod-like compound tends to be aligned in a predetermined direction.

The rod-like compound preferably exhibits a lyotropic liquid crystallinity.

The rod-like compound is preferably water-soluble from a viewpoint that it is easy to control the expression of liquid crystallinity. The water-soluble rod-like compound represents a rod-like compound that dissolves in 1% by mass or more in water, and preferably a rod-like compound that dissolves in 5% by mass or more in water.

The "rod-like compound" indicates a compound having a structure in which aromatic rings (such as an aromatic hydrocarbon ring and an aromatic heterocyclic ring) are one-dimensionally linked via a single bond or an appropriate linking group, and a compound group having a property of being aligned so that major axes thereof are aligned in parallel with each other in a solvent.

The rod-like compound has a maximal absorption wavelength in a wavelength range of 330 nm or more. That is, the rod-like compound has a maximal absorption peak in the wavelength range of 330 nm or more.

The maximal absorption wavelength means a wavelength at which an absorbance of the rod-like compound takes a maximal value in an absorption spectrum (measurement range: wavelength range of 250 to 700 nm) thereof. In a case where there are a plurality of maximal values in the absorbance of the absorption spectrum of the rod-like compound, a wavelength of the maximal value with the highest absorbance is selected.

Among these, the rod-like compound preferably has a maximal absorption wavelength in a range of 330 to 365 nm from the viewpoint that the effect of the present invention is excellent.

A measuring method of the maximal absorption wavelength is as follows.

The rod-like compound (5 to 50 mg) is dissolved in pure water (1,000 ml), and the absorption spectrum of the obtained solution is measured using a spectrophotometer (MPC-3100 (manufactured by SHIMADZU)).

The rod-like compound is not particularly limited as long as the compound satisfies the above requirements for the maximal absorption wavelength, and a polymer exhibiting lyotropic liquid crystallinity is preferable.

Among these, from the viewpoint that the effect of the present invention is excellent, the rod-like compound is preferably at least one selected from the group consisting of a polymer having a repeating unit represented by Formula (2) and a polymer having a repeating unit represented by Formula (3).

(2)

In the formula, $Ar_{21}$, $Ar_{22}$, and $Ar_{23}$ each independently represent a divalent aromatic ring which may have a substituent.

The divalent aromatic ring may be either a monocyclic ring or a polycyclic ring.

Examples of the divalent aromatic ring include a divalent aromatic hydrocarbon ring and a divalent aromatic heterocyclic ring. Examples of the divalent aromatic hydrocarbon ring include a group obtained by excluding two hydrogen atoms directly bonded to an aromatic hydrocarbon ring such as a benzene ring, a naphthalene ring, an anthracene ring, and a phenanthroline ring. Examples of the divalent aromatic heterocyclic ring include a group obtained by excluding two hydrogen atoms directly bonded to an aromatic heterocyclic ring such as a furan ring, a pyrrole ring, a thiophene ring, a pyridine ring, a thiazole ring, and a benzothiazole ring.

Examples of the substituent which may be contained in the divalent aromatic ring include groups exemplified by the substituents which may be contained in the monovalent aromatic ring.

A suitable aspect of the substituent which may be contained in the divalent aromatic ring is the same as the suitable aspect of the substituent which may be contained in the monovalent aromatic ring, and the sulfo group (—SO$_3$H) or a salt thereof, a carboxyl group or a salt thereof, or a group having a hydroxy group is preferable.

R represents a hydrogen atom or a substituent. Examples of the substituent include groups exemplified by the substituents which may be contained in the monovalent aromatic ring.

$X_2$ represents a single bond or a divalent linking group. The definition of the divalent linking group represented by $X_2$ is the same as the definition of the divalent linking group represented by L described above.

As the divalent linking groups represented by $X_2$, —CH=CH—, —CH=N—, —N=N—, —C≡C—, —C≡C—C≡C—, an arylene group, or a heteroarylene group is preferable.

$m_2$ represents an integer of 0 to 3, and is preferably 1 or 2, and is more preferably 1 from the viewpoint that the effect of the present invention is excellent.

In a case where $m_2$ is 2 or more, a plurality of $X_2$'s and a plurality of $Ar_{23}$'s may be the same as or different from each other, respectively.

(3)

In the formula. $Ar_3n$ represents a tetravalent aromatic ring which may have a substituent.

The tetravalent aromatic ring may be either a monocyclic ring or a polycyclic ring.

Examples of the tetravalent aromatic ring include a tetravalent aromatic hydrocarbon ring and a tetravalent aromatic heterocyclic ring. Examples of the tetravalent aromatic hydrocarbon ring include a group obtained by excluding four hydrogen atoms directly bonded to an aromatic hydrocarbon ring such as a benzene ring, a naphthalene ring, an anthracene ring, and a phenanthroline ring. Examples of the tetravalent aromatic heterocyclic ring include a group obtained by excluding four hydrogen atoms directly bonded to an aromatic heterocyclic ring such as a furan ring, a pyrrole ring, a thiophene ring, a pyridine ring, a thiazole ring, and a benzothiazole ring.

Examples of the substituent which may be contained in the tetravalent aromatic ring include groups exemplified by the substituents which may be contained in the monovalent aromatic ring.

A suitable aspect of the substituent which may be contained in the tetravalent aromatic ring is the same as the suitable aspect of the substituent which may be contained in the monovalent aromatic ring, and the sulfo group (—SO$_3$H) or a salt thereof, a carboxyl group or a salt thereof, or a group having a hydroxy group is preferable.

$Ar_{32}$ and $Ar_{33}$ each independently represent a divalent aromatic ring which may have a substituent.

The definition of the divalent aromatic ring which may have a substituent represented by $Ar_{32}$ and $Ar_{33}$ is the same as the definition of the divalent aromatic ring which may have a substituent represented by $Ar_{21}$, $Ar_{22}$, or $Ar_{23}$ described above.

$X_3$ represents a single bond or a divalent linking group. The definition of the divalent linking group represented by $X_3$ is the same as the definition of the divalent linking group represented by L described above.

As the divalent linking groups represented by $X_3$, —CH=CH—, —CH=N—, —N=N—, —C≡C—, —C≡C—C≡C—, an arylene group, or a heteroarylene group is preferable.

$m_3$ represents an integer of 0 to 3, and is preferably 1 or 2, and is more preferably 1 from the viewpoint that the effect of the present invention is excellent.

In a case where $m_3$ is 2 or more, a plurality of $X_3$'s and a plurality of $Ar_{33}$'s may be the same as or different from each other, respectively.

The rod-like compound may have a polymerizable group. The definition of the polymerizable group is the same as that of the polymerizable group which may be contained in the above-mentioned specific compound.

The content of the repeating unit represented by Formula (2) included in the polymer having the repeating unit represented by Formula (2) is not particularly limited, and is preferably 60% by mole or more, and more preferably 80% by mole or more, with respect to all the repeating units in the polymer. An upper limit thereof is 100% by mole.

The content of the repeating unit represented by Formula (3) included in the polymer having the repeating unit represented by Formula (3) is not particularly limited, and is preferably 60% by mole or more, and more preferably 80% by mole or more, with respect to all the repeating units in the polymer. An upper limit thereof is 100% by mole.

The molecular weight of the polymer having the repeating unit represented by Formula (2) is not particularly limited, and the number of the repeating units represented by Formula (2) in the polymer is preferably 10 to 100,000, and more preferably 100 to 10,000.

The molecular weight of the polymer having the repeating unit represented by Formula (3) is not particularly limited, and the number of the repeating units represented by Formula (3) in the polymer is preferably 10 to 100,000, and more preferably 100 to 10,000.

<Other Components>

The composition may comprise other components, in addition to the specific compound and the rod-like compound.

For example, the composition may comprise a near infrared absorbing compound having a maximal absorption wavelength in the wavelength range of 700 to 1,000 nm. In a case where the composition comprises the near infrared absorbing compound, the reverse wavelength dispersibility of the optically anisotropic film becomes closer to an ideal curve.

Examples of the near infrared absorbing compound include diketopyrrolopyrrole-based coloring agents, diimmonium-based coloring agents, phthalocyanine-based coloring agents, naphthalocyanine-based coloring agents, azo-based coloring agents, polymethine-based coloring agents, anthraquinone-based coloring agents, pyrylium-based coloring agents, squarylium-based coloring agents, triphenylmethane-based coloring agents, cyanine-based coloring agents, oxonol-bases coloring agents, and aminium-based coloring agents.

As the near infrared absorbing compound, a water-soluble compound having a rod-like skeleton and a transition moment along the molecular major axis is preferable. Specific examples thereof include a cyanine coloring agents and oxonol coloring agents.

The near infrared absorbing compound may have a mesogenic group. Since the near infrared absorbing compound has the mesogenic group, it is easy to align with the specific compound and the rod-like compound, and the reverse wavelength dispersibility of the optically anisotropic film becomes closer to the ideal curve.

The mesogenic group is a functional group which is rigid and has aligning properties. Examples of a structure of the mesogenic group include a structure formed by linking a plurality of groups selected from the group consisting of an aromatic ring group (an aromatic hydrocarbon ring group and an aromatic heterocyclic group) and an alicyclic group directly or via a linking group.

A content of the near infrared absorbing compound in the composition is preferably 0.1 to 10 parts by mass, and more preferably 1 to 5 parts by mass, with respect to the total mass of the specific compound and the rod-like compound.

The composition may further comprise a polymerizable monomer.

The polymerizable monomer is preferably water-soluble.

The polymerizable monomer may be a polymerizable monomer exhibiting liquid crystallinity.

A content of the polymerizable monomer in the composition is preferably 5 to 50 parts by mass, and more preferably 10 to 30 parts by mass, with respect to the total mass of the specific compound and the rod-like compound.

The composition may comprise a solvent. Examples of the solvent include water, polar solvents such as alcohol and dimethylformamide, and non-polar solvents such as hexane. Among these, the polar solvents are preferable, and the water and the alcohol are more preferable.

The composition may comprise a polymerization initiator. The polymerization initiator is preferably water-soluble. The water-soluble polymerization initiator represents a polymerization initiator that dissolves in 1% by mass or more in water, and preferably a polymerization initiator that dissolves in 5% by mass or more in water.

Examples of the polymerization initiator include a photopolymerization initiator and a thermal polymerization initiator.

The composition may contain a compound represented by Formula (4).

$$(4)$$

In the formula, $W_1$ and $W_2$ each independently represent a hydrogen atom, an alkyl group having 1 to 30 carbon atoms, a sulfonic acid group or a salt thereof, a phosphonic acid group or a salt thereof, or a polymerizable group, R represents a hydrogen atom or a methyl group, and n represents the number of repeating units.

The compound represented by Formula (4) is preferably a nonionic compound, and as $W_1$ and $W_2$, a hydrogen atom, an alkyl group having 1 to 30 carbon atoms, or a polymerizable group is preferable.

A type of the polymerizable group is not particularly limited, and a radically polymerizable group or a cationically polymerizable group is preferable. Specific examples of the radically polymerizable group and the cationically polymerizable group are as described above.

n is preferably 2 to 100, and more preferably 4 to 20.

A content of the compound represented by Formula (4) in the composition is preferably 0.1 to 30 parts by mass, and more preferably 1 to 20 parts by mass, with respect to the total mass of the specific compound and the rod-like compound.

In addition to the above, additives which may be contained in the composition include wavelength dispersion control agents, optical property adjusters, surfactants, adhesion improvers, slip agents, alignment control agents, and ultraviolet absorbers.

<Composition>

The composition according to the embodiment of the present invention comprises at least the above-mentioned specific compound and rod-like compound. The composition is a lyotropic liquid crystalline composition.

Here, the lyotropic liquid crystalline composition is a composition having a property of causing a phase transition between an isotropic phase and a liquid crystal phase by changing a temperature or a concentration in a solution state. That is, the composition according to the embodiment of the present invention is a composition capable of exhibiting lyotropic liquid crystallinity by adjusting a concentration of each compound in a solution state containing the specific compound, the rod-like compound, and the solvent. In a case of showing the lyotropic liquid crystallinity in a case where the concentration changes, for example, in a case where the composition contains an excess solvent and does not exhibit the lyotropic liquid crystallinity in that state, but exhibits the lyotropic liquid crystallinity in a drying step after application of the composition, the composition corresponds to under the above-mentioned lyotropic liquid crystalline composition.

A total content of the specific compound and the rod-like compound in the composition is not particularly limited, and is preferably 60 to 100%% by mass, and more preferably 80% to 99% by mass with respect to the total solid content in the composition.

The total solid content means a component with which an optically anisotropic film can be formed, excluding a solvent. Even in a case where the properties of the above components are liquid, the content is calculated as a solid content.

The content of the specific compound with respect to the total mass of the specific compound and the rod-like compound is not particularly limited, and is preferably more than 50% by mass, and more preferably 60% by mass or more, from the viewpoint that the effect of the present invention is excellent. An upper limit thereof is not particularly limited, and is preferably 90% by mass or less, and more preferably 80% by mass or less.

Furthermore, the composition according to the embodiment of the present invention may comprise a solvent.

A concentration of solid contents in the composition according to the embodiment of the present invention is not particularly limited, and is preferably 1% to 50% by mass, and more preferably 3% to 30% by mass with respect to the total mass of the composition, from the viewpoint that the effect of the present invention is excellent.

As described above, the composition according to the embodiment of the present invention is a lyotropic liquid crystalline composition. Therefore, the composition according to the embodiment of the present invention may have an aspect of comprising a predetermined amount of a solvent and exhibiting lyotropic liquid crystallinity (a state in which the lyotropic liquid crystallinity is expressed), or may be a composition which comprises an excessive amount of a solvent and does not exhibit lyotropic liquid crystallinity (exhibiting an isotropic phase) in the state, but exhibits the lyotropic liquid crystallinity during formation of a coating film due to volatilization of the solvent when forming the optically anisotropic layer.

As will be described later, in a case where an alignment film is arranged on a support, an alignment of the compound is induced by exhibiting the lyotropic liquid crystallinity in a drying process after the composition is applied, and it becomes possible to form the optically anisotropic film.

The composition may comprise only one kind of the specific compound, or may comprise two or more kinds of the specific compound.

The composition may comprise only one kind of the rod-like compound, or may comprise two or more kinds of the rod-like compound.

<Method for Producing Optically Anisotropic Film>

The method for producing the optically anisotropic film according to the embodiment of the present invention is not particularly limited as long as the above-mentioned composition is used. For example, a method in which the composition according to the embodiment of the present invention is applied to form a coating film and a state in which the specific compound and the rod-like compound in the coating film are aligned is fixed to form an optically anisotropic film is preferable.

Hereinafter, the procedure of the method will be described in detail.

First, the composition is applied to form a coating film. Usually, the composition is often applied on a support.

The support to be used is a member having a function as a base material for applying a composition thereon. The support may be a so-called temporary support.

Examples of the support (temporary support) include a plastic substrate or a glass substrate. Examples of a material constituting the plastic substrate include a polyester resin such as polyethylene terephthalate, a polycarbonate resin, a (meth)acryl resin, an epoxy resin, a polyurethane resin, a polyamide resin, a polyolefin resin, a cellulose resin, a silicone resin, and polyvinyl alcohol.

The thickness of the support only needs to be about 5 to 1,000 μm, and is preferably 10 to 250 μm, and more preferably 15 to 90 μm.

Moreover, an alignment film may be arranged on the support, as desired.

The alignment film generally has a polymer as a main component. Polymers for an alignment film are described in many documents and a large number of commercially available products thereof can be obtained. As the polymers for an alignment film, polyvinyl alcohol, polyimide, or a derivative thereof is preferable.

In addition, it is preferable that the alignment film is subjected to a known rubbing treatment.

Further, as the alignment film, a photo-alignment film may be used.

The thickness of the alignment film is preferably 0.01 to 10 μm and more preferably 0.01 to 1 μm.

Examples of an application method include a known method such as a curtain coating method, an extrusion coating method, a roll coating method, a dip coating method, a spin coating method, a print coating method, a spray coating method, and a slide coating method.

Further, in a case where the application method for applying shear stress is adopted, two treatments of alignment of the compound and application can be performed at the same time.

In addition, by continuous application, the specific compound and the rod-like compound may be continuously aligned at the same time as application. Examples of the continuous application include a curtain coating method, an extrusion coating method, a roll coating method, and a slide coating method. As a specific application means, it is preferable to use a die coater, a blade coater, or a bar coater.

As means for aligning the specific compound and the rod-like compound in the coating film, as described above, a method of applying shear stress can be mentioned.

The specific compound and the rod-like compound can take an alignment state as shown in FIG. 1.

As desired, the coating film formed on the support may be heat-treated.

Furthermore, the condition in a case of heating the coating film is not particularly limited, and the heating temperature is preferably 50° C. to 250° C., and the heating time is preferably 10 seconds to 10 minutes.

Moreover, after heating the coating film, the coating film may be cooled, as desired. The cooling temperature is preferably 20° C. to 200° C., and more preferably 20° C. to 150° C.

As another means for aligning the specific compound and the rod-like compound in the coating film, as described above, a method of using the alignment film can be mentioned.

By performing an alignment treatment in a predetermined direction on the alignment film in advance, the alignment direction can be controlled. In particular, in a case where continuous application is performed using a roll-shaped support and the alignment is oblique with respect to the transport direction, a method of using the alignment film is preferable.

In the method using an alignment film, the concentration of the solvent in the composition used is not particularly limited, and a solvent concentration at which the composition exhibits lyotropic liquid crystallinity may be adopted, or the concentration equal to or lower than the concentration may be adopted. As described above, since the composition according to the embodiment of the present invention is the lyotropic liquid crystalline composition, even in a case where the concentration of the solvent in the composition is high (in a case where the composition itself exhibits an isotropic phase), an alignment of the compound on the alignment film is induced by exhibiting the lyotropic liquid crystallinity in a drying process after the composition is applied, and it becomes possible to form the optically anisotropic film.

The method for fixing the alignment state of the specific compound and the rod-like compound is not particularly limited, and examples thereof include a method of heating and then cooling the coating film as described above.

Further, in a case where at least one of the specific compound or the rod-like compound has a polymerizable group, or in a case where a polymerizable monomer is used, in order to fix the alignment state of the specific compound and the rod-like compound, the coating film is subjected to a curing treatment (an ultraviolet irradiation (light irradiation treatment) or a heat treatment) to fix the alignment state (polymerization fixation), and the optically anisotropic film may be formed.

A method for the curing treatment to be carried out on the coating film is not particularly limited, and examples thereof include a light irradiation treatment and a heating treatment. Among these, from the viewpoint of manufacturing suitability, the light irradiation treatment is preferable, and an ultraviolet ray-irradiation treatment is more preferable.

An irradiation condition for the light irradiation treatment is not particularly limited, and an irradiation dose of 50 to 1,000 mJ/cm² is preferable.

<Optically Anisotropic Film>

The optically anisotropic film is a film formed by using the composition according to the embodiment of the present invention described above. As described above, the optically anisotropic film is formed by fixing the state in which the specific compound and the rod-like compound are aligned.

The optically anisotropic film exhibits reverse wavelength dispersibility. In the present specification, the reverse wavelength dispersibility means that in a case where the in-plane retardation (Re) value is measured in at least a part of the wavelength region of the visible light region, an Re value becomes the same as or becomes higher than the measured wavelength. In the present invention, the optically anisotropic film exhibits the reverse wavelength dispersibility as long as the film satisfies the following relations of Formula (A) and Formula (B).

$$Re(450)/Re(550)<1.00 \quad \text{Formula (A)}$$

Re(450) represents an in-plane retardation of the optically anisotropic film at a wavelength of 450 nm and Re(550) represents an in-plane retardation of the optically anisotropic film at a wavelength of 550 nm.

Among those, Re(450)/Re(550) is preferably 0.97 or less, more preferably 0.92 or less, and still more preferably 0.87 or less. A lower limit thereof is not particularly limited, and is often 0.75 or more, and preferably 0.78 or more.

$$Re(650)/Re(550)>1.00, \quad \text{Formula (B)}$$

Re(650) represents an in-plane retardation of the optically anisotropic film at a wavelength of 650 nm.

Among these, Re(650)/Re(550) is preferably 1.02 or more, and more preferably 1.05 or more. An upper limit thereof is not particularly limited, and is preferably 1.25 or less, and more preferably 1.20 or less.

The optically anisotropic film exhibits biaxiality (nx>nz>ny).

An Nz factor of the optically anisotropic film is not particularly limited, and is preferably 0.1 to 0.8, and more preferably 0.2 to 0.7, from the viewpoint of combination with other members.

Re(550) of the optically anisotropic film is not particularly limited, and from the viewpoint that the optically anisotropic film is useful as a λ/4 plate, Re(550) is preferably 110 to 160 nm, and more preferably 120 to 150 nm.

Rth(550) of the optically anisotropic film is not particularly limited, and is preferably −50 to 40 nm, and more preferably −40 to 30 nm.

The thickness of the optically anisotropic film is not particularly limited, and is preferably 10 μm or less, more preferably 0.5 to 8.0 μm, and still more preferably 0.5 to 6.0 μm from the viewpoint of reducing the thickness.

In addition, in the present specification, the thickness of the optically anisotropic film is intended to mean an average thickness of the optically anisotropic film. The average thickness is determined by measuring the thickness at any five or more points of the optically anisotropic film and obtaining an arithmetic mean of the values.

The above-mentioned optically anisotropic film can be applied to various uses, and it can also be used as, for example, a so-called λ/4 plate or λ/2 plate by adjusting the in-plane retardation of the optically anisotropic film.

Furthermore, the λ/4 plate is a plate having a function of converting linearly polarized light having a specific wavelength into circularly polarized light (or converting circularly polarized light into linearly polarized light). More specifically, the λ/4 plate is a plate in which an in-plane retardation Re at a predetermined wavelength of λ nm is λ/4 (or an odd number of times thereof).

The in-plane retardation (Re(550)) of the λ/4 plate at a wavelength of 550 nm may have an error of about 25 nm from an ideal value (137.5 nm) at a center, and is, for example, preferably 110 to 160 nm, and more preferably 120 to 150 nm.

In addition, the λ/2 plate is an optically anisotropic film in which the in-plane retardation Re(λ) at a specific wavelength of λ nm satisfies Re(λ)≠λ/2. This formula only needs to be satisfied at any wavelength (for example, 550 nm) in the visible light region. Above all, it is preferable that the in-plane retardation Re(550) at a wavelength of 550 nm satisfies the following relationship.

210 nm≤Re(550)≤300 nm

<Optical Film>

The optically anisotropic film may be used as an optical film in combination with another layer. That is, the optical film according to the embodiment of the present invention comprises the above-mentioned optically anisotropic film and another layer.

Examples of the other layer include the above-mentioned alignment film and the support.

An arrangement position of the optically anisotropic film in the optical film is not particularly limited, and examples thereof include an aspect having a support, an alignment film, and an optically anisotropic film in this order.

<Polarizing Plate>

The optically anisotropic film according to the embodiment of the present invention can be suitably applied to a polarizing plate.

That is, the polarizing plate according to the embodiment of the present invention (preferably a circularly polarizing plate) comprises an optically anisotropic film or an optical film and a polarizer. The circularly polarizing plate is an optical element that converts unpolarized light into circularly polarized light.

The polarizer only needs to be a member (linear polarizer) having a function of converting light into specific linearly polarized light, and an absorptive type polarizer can be usually used.

Examples of the absorptive type polarizer include an iodine-based polarizer, a dye-based polarizer using a dichroic dye, and a polyene-based polarizer. The iodine-based polarizer and the dye-based polarizer are classified into a coating type polarizer and a stretching type polarizer, both of which can be applied, but a polarizer which is manufactured by allowing polyvinyl alcohol to adsorb iodine or a dichroic dye and performing stretching is preferable.

A relationship between the absorption axis of the polarizer and the slow axis of the optically anisotropic film is not particularly limited, and in a case where the optically anisotropic film is a λ/4 plate and the optical film is used as a circularly polarizing film, an angle formed between the absorption axis of the polarizer and the slow axis of the optically anisotropic film is preferably in a range of 45°±10°. That is, an angle formed by the absorption axis of the polarizer and the slow axis of the optically anisotropic film is preferably in the range of 35° to 55°.

<Organic EL Display Device>

The circularly polarizing plate of the present invention can be suitably applied to an organic EL display device. That is, the circularly polarizing plate according to the embodiment of the present invention can be suitably used as a so-called antireflection film.

A suitable aspect of the organic EL display device of the present invention includes an aspect of including an organic electroluminescence display element having a substrate, a metal electrode layer, a light emitting layer consisting of an organic material, and a transparent electrode layer, and a circularly polarizing plate. In the above aspect, the optically anisotropic film in the circularly polarizing plate is arranged closer to the organic EL display element than the polarizer.

A total value of a thickness-direction retardation of all members existing between the metal electrode layer and the polarizer at a wavelength of 550 nm is not particularly limited, and is preferably within 0±30 nm (that is, within a range of −30 to 30 nm) from the viewpoint that light leakage in a case of visual recognition from an oblique direction can be further suppressed.

EXAMPLES

Hereinafter, the features of the present invention will be described in more details with reference to Examples and Comparative Examples. The materials, the amounts of materials used, the proportions, the treatment details, and the treatment procedure shown in Examples below can be appropriately modified as long as the modifications do not depart from the spirit of the present invention. Therefore, the scope of the present invention should not be construed as being limited to specific examples shown below.

<Synthesis>

The following specific compounds 1-1 to 1-4 and rod-like compounds 2-1 and 3-1 were synthesized by a known method.

The specific compounds 1-1 to 1-4 correspond to water-soluble specific compounds, and the rod-like compounds 2-1 and 3-1 correspond to water-soluble rod-like compounds.

1-1

-continued 1-2

1-3

1-4

2-1

3-1

The specific compound 1-1 had a maximal absorption wavelength at 274 nm in the wavelength range of 250 to 700 nm.

The specific compound 1-2 had a maximal absorption wavelength at 273 nm in the wavelength range of 250 to 700 nm.

Specific compounds 1-3 had a maximal absorption wavelength at 278 nm in the wavelength range of 250 to 700 nm.

The specific compound 1-4 had a maximal absorption wavelength at 273 nm in the wavelength range of 250 to 700 nm.

The rod-like compound 2-1 had a maximal absorption wavelength at 345 nm in the wavelength range of 250 to 700 nm.

The rod-like compound 3-1 had a maximal absorption wavelength at 363 nm in the wavelength range of 250 to 700 nm.

Example 1

(Manufacture of Alkali Saponification-Treated Substrate)

A commercially available triacetyl cellulose film "Z-TAC" (manufactured by FUJIFILM Corporation) was used as a substrate. The Z-TAC was allowed to pass through a dielectric heating roll at a temperature of 60° C., the film surface temperature was elevated up to 40° C., then an alkaline solution having the composition shown below was applied onto one surface of the film at an application amount of 14 ml/m$^2$ with a bar coater and heated at 110° C., and was transported for 10 seconds under a steam-type far-infrared heater manufactured by Noritake Co., Ltd. Subsequently, pure water was applied onto the obtained film at 3 ml/m$^2$ using the same bar coater. Next, the obtained film was three times repeatedly subjected to washing with water using a fountain coater and draining using an air knife, then transported to a drying zone at 70° C. for 10 seconds, and dried to manufacture an alkali saponification-treated substrate.

| Alkaline solution | |
| --- | --- |
| Potassium hydroxide | 4.7 parts by mass |
| Water | 15.8 parts by mass |
| Isopropanol | 63.7 parts by mass |
| Surfactant | |
| SF-1: $C_{14}H_{29}O(CH_2CH_2O)_2OH$ | 1.0 part by mass |
| Propylene glycol | 14.8 parts by mass |

(Manufacture of Alignment Film)

The following composition for forming an alignment film was applied onto the substrate prepared above with a wire bar of #8. The obtained film was dried with warm air at 60° C. for 60 seconds and further dried with warm air at 100° C. for 120 seconds to form a coating film.

| Composition for forming alignment film | |
| --- | --- |
| Modified polyvinyl alcohol | 2.4 parts by mass |
| Isopropyl alcohol | 1.6 parts by mass |
| Methanol | 36 parts by mass |
| Water | 60 parts by mass |

Modified polyvinyl alcohol

In the structural formula, a numerical value described in each repeating unit represents % by mole of each repeating unit with respect to all the repeating units.

(Manufacture of Optically Anisotropic Film 1)

A composition 1 for forming an optically anisotropic film having the following composition was prepared. The composition 1 for forming an optically anisotropic film was a composition exhibiting lyotropic liquid crystallinity.

| Composition 1 for forming optically anisotropic film | |
| --- | --- |
| Specific compound 1-2 | 70 parts by mass |
| Rod-like compound 3-1 | 30 parts by mass |
| Water | 900 parts by mass |

A surface of the coating film of the substrate on which the coating film was formed on the surface was subjected to a rubbing treatment so that a rubbing direction was 45° with respect to a longitudinal direction of the substrate to form an alignment film.

Next, the composition 1 for forming an optically anisotropic film prepared above was applied onto the rubbing-treated surface. Next, the obtained substrate was heat-aged at a film surface temperature of 60° C. for 60 seconds and cooled to room temperature to fix the alignment state, whereby an optically anisotropic film 1 was manufactured.

The slow axis direction of the manufactured optically anisotropic film 1 was orthogonal to the rubbing direction. In a case where the optical characteristics of the optically anisotropic film 1 were measured, Re(550) was 145 nm, Re(450)/Re(550) was 0.80, and Re(650)/Re(550) was 1.07. Rth(550) was −10 nm.

The optically anisotropic film 1 exhibited reverse wavelength dispersibility and satisfied the relationship of nx>nz>ny.

(Manufacture of Circularly Polarizing Plate 1)

TD80UL (manufactured by FUJIFILM Corporation) was immersed in a 1.5 specified sodium hydroxide aqueous solution at 55° C. for 2 minutes. Then, the obtained substrate was washed in a water washing bath at room temperature and neutralized at 30° C. with 0.1 N sulfuric acid. Next, the obtained substrate was washed again in a water washing bath at room temperature, and further dried with warm air at 100° C. to manufacture an alkali saponification-treated protective film.

Subsequently, a roll-shaped polyvinyl alcohol film having a thickness of 80 μm was continuously stretched 5 times in an aqueous iodine solution and dried to obtain a polarizer having a thickness of 20 μm.

The protective film produced above was bonded to one surface of the polarizer manufactured above, and the substrate surface of the optically anisotropic film 1 manufactured above was bonded to the other surface to sandwich the polarizer to manufacture the circularly polarizing plate 1 in which a protective film and the optically anisotropic film 1 were arranged on both sides of the polarizer was produced.

An aqueous solution of a polyvinyl alcohol-based adhesive was used for bonding. Also, the bonding was made so that the slow axis of the optically anisotropic film 1 and the absorption axis of the polarizer were at 45°.

Example 2

A composition 2 for forming an optically anisotropic film having the following composition was prepared. The composition 2 for forming an optically anisotropic film was a composition exhibiting lyotropic liquid crystallinity.

| Composition 2 for forming optically anisotropic film | |
| --- | --- |
| Specific compound 1-4 | 70 parts by mass |
| Rod-like compound 2-1 | 30 parts by mass |

| Composition 2 for forming optically anisotropic film | |
| --- | --- |
| Water-soluble polymerization initiator Irgacure2959 (manufactured by BASF) | 3 parts by mass |
| Water | 900 parts by mass |

A surface of the coating film of the substrate manufactured in Example 1, on which the coating film was formed on the surface, was subjected to a rubbing treatment so that a rubbing direction was 45° with respect to a longitudinal direction of the substrate.

Next, the composition 2 for forming an optically anisotropic film prepared above was applied onto the rubbing-treated surface. Next, the obtained substrate was heat-aged at a film surface temperature of 60° C. for 60 seconds, cooled to room temperature, and then irradiated with ultraviolet rays for 25 seconds using an air-cooled metal halide lamp (manufactured by Eye Graphics Co., Ltd.) of 20 mW/cm$^2$, to fix the alignment state, whereby the optically anisotropic film 2 was manufactured.

The slow axis direction of the manufactured optically anisotropic film 2 was orthogonal to the rubbing direction. In a case where the optical characteristics of the optically anisotropic film 2 were measured, Re(550) was 140 nm, Re(450)/Re(550) was 0.82, and Re(650)/Re(550) was 1.06. Rth(550) was −15 nm.

The optically anisotropic film 2 exhibited reverse wavelength dispersibility and satisfied the relationship of nx>nz>ny.

Example 3

A composition 3 for forming an optically anisotropic film having the following composition was prepared. The composition 3 for forming an optically anisotropic film was a composition exhibiting lyotropic liquid crystallinity.

| Composition 3 for forming optically anisotropic film | |
| --- | --- |
| Specific compound 1-4 | 70 parts by mass |
| Rod-like compound 2-1 | 30 parts by mass |
| PEG600 (manufactured by FUJIFILM Wako Pure Chemical Corporation) | 8 parts by mass |
| Water | 900 parts by mass |

A surface of the coating film of the substrate manufactured in Example 1, on which the coating film was formed on the surface, was subjected to a rubbing treatment so that a rubbing direction was 45° with respect to a longitudinal direction of the substrate.

Next, the composition 3 for forming an optically anisotropic film prepared above was applied onto the rubbing-treated surface. Next, the obtained substrate was heat-aged at a film surface temperature of 60° C. for 60 seconds and cooled to room temperature to fix the alignment state, whereby an optically anisotropic film 3 was manufactured.

The slow axis direction of the manufactured optically anisotropic film 3 was orthogonal to the rubbing direction. In a case where the optical characteristics of the optically anisotropic film 3 were measured, Re(550) was 140 nm, Re(450)/Re(550) was 0.82, and Re(650)/Re(550) was 1.06. Rth(550) was −12 nm.

The optically anisotropic film 3 exhibited reverse wavelength dispersibility and satisfied the relationship off nx>nz>ny.

Example 4

A composition 4 for forming an optically anisotropic film having the following composition was prepared. The composition 4 for forming an optically anisotropic film was a composition exhibiting lyotropic liquid crystallinity.

| Composition 4 for forming optically anisotropic film | |
| --- | --- |
| Specific compound 1-4 | 70 parts by mass |
| Rod-like compound 3-1 | 30 parts by mass |
| Polymerizable monomer A-600 (manufactured by Shin-Nakamura Chemical Co., Ltd.) | 10 parts by mass |
| Water-soluble polymerization initiator Irgacure2959 (manufactured by BASF) | 3 parts by mass |
| Water | 900 parts by mass |

A surface of the coating film of the substrate manufactured in Example 1, on which the coating film was formed on the surface, was subjected to a rubbing treatment so that a rubbing direction was 45° with respect to a longitudinal direction of the substrate.

Next, the composition 4 for forming an optically anisotropic film prepared above was applied onto the rubbing-treated surface. Next, the obtained substrate was heat-aged at a film surface temperature of 60° C. for 60 seconds, cooled to room temperature, and then irradiated with ultraviolet rays for 25 seconds using an air-cooled metal halide lamp (manufactured by Eye Graphics Co., Ltd.) of 20 mW/cm$^2$, to fix the alignment state, whereby the optically anisotropic film 4 was manufactured.

The slow axis direction of the manufactured optically anisotropic film 4 was orthogonal to the rubbing direction. In a case where the optical characteristics of the optically anisotropic film 4 were measured, Re(550) was 138 nm, Re(450)/Re(550) was 0.83, and Re(650)/Re(550) was 1.06. Rth(550) was −16 nm.

The optically anisotropic film 4 exhibited reverse wavelength dispersibility and satisfied the relationship of nx>nz>ny.

Example 5

A composition 5 for forming an optically anisotropic film having the following composition was prepared. The composition 5 for forming an optically anisotropic film was a composition exhibiting lyotropic liquid crystallinity.

| Composition 5 for forming optically anisotropic film | |
| --- | --- |
| Specific compound 1-3 | 70 parts by mass |
| Rod-like compound 2-1 | 30 parts by mass |
| Polymerizable monomer FAM-401 (manufactured by FUJIFILM Corporation) | 10 parts by mass |
| Water-soluble polymerization initiator Irgacure2959 (manufactured by BASF) | 3 parts by mass |
| Water | 900 parts by mass |

A surface of the coating film of the substrate manufactured in Example 1, on which the coating film was formed on the surface, was subjected to a rubbing treatment so that a rubbing direction was 45° with respect to a longitudinal direction of the substrate.

Next, the composition 5 for forming an optically anisotropic film prepared above was applied onto the rubbing-treated surface. Next, the obtained substrate was heat-aged at a film surface temperature of 60° C. for 60 seconds, cooled to room temperature, and then irradiated with ultraviolet rays for 25 seconds using an air-cooled metal halide lamp (manufactured by Eye Graphics Co., Ltd.) of 20 mW/cm², to fix the alignment state, whereby the optically anisotropic film 5 was manufactured.

The slow axis direction of the manufactured optically anisotropic film 5 was orthogonal to the rubbing direction. In a case where the optical characteristics of the optically anisotropic film 5 were measured, Re(550) was 140 nm, Re(450)/Re(550) was 0.82, and Re(650)/Re(550) was 1.06. Rth(550) was −15 nm.

The optically anisotropic film 5 exhibited reverse wavelength dispersibility and satisfied the relationship of nx>nz>ny.

Example 6

A composition 6 for forming an optically anisotropic film having the following composition was prepared. The composition 6 for forming an optically anisotropic film was a composition exhibiting lyotropic liquid crystallinity.

| Composition 6 for forming optically anisotropic film | |
|---|---|
| Specific compound 1-1 | 70 parts by mass |
| Rod-like compound 2-1 | 30 parts by mass |
| Near infrared absorbing compound 1 | 2 parts by mass |
| Water | 900 parts by mass |

Near infrared absorbing compound 1

A surface of the coating film of the substrate manufactured in Example 1, on which the coating film was formed on the surface, was subjected to a rubbing treatment so that a rubbing direction was 45° with respect to a longitudinal direction of the substrate.

Next, the composition 6 for forming an optically anisotropic film prepared above was applied onto the rubbing-treated surface. Next, the obtained substrate was heat-aged at a film surface temperature of 60° C. for 60 seconds and cooled to room temperature to fix the alignment state, whereby an optically anisotropic film 6 was manufactured.

The slow axis direction of the manufactured optically anisotropic film 6 was orthogonal to the rubbing direction. In a case where the optical characteristics of the optically anisotropic film 6 were measured, Re(550) was 150 nm, Re(450)/Re(550) was 0.80, and Re(650)/Re(550) was 1.12. Rth(550) was −10 nm.

The optically anisotropic film 6 exhibited reverse wavelength dispersibility and satisfied the relationship of nx>nz>ny.

Example 7

A composition 7 for forming an optically anisotropic film having the following composition was prepared. The composition 7 for forming an optically anisotropic film was a lyotropic liquid crystalline composition, but was a composition showing an isotropic phase at the following concentrations.

| Composition 7 for forming optically anisotropic film | |
|---|---|
| Specific compound 1-1 | 70 parts by mass |
| Rod-like compound 2-1 | 30 parts by mass |
| PEG600 (manufactured by FUJIFILM Wako Pure Chemical Corporation) | 8 parts by mass |
| Water | 900 parts by mass |
| Methanol | 500 parts by mass |

A surface of the coating film of the substrate manufactured in Example 1, on which the coating film was formed on the surface, was subjected to a rubbing treatment so that a rubbing direction was 45° with respect to a longitudinal direction of the substrate.

Next, the composition 7 for forming an optically anisotropic film prepared above was applied onto the rubbing-treated surface. Next, the obtained substrate was heat-aged at a film surface temperature of 60° C. for 120 seconds and cooled to room temperature to fix the alignment state, whereby an optically anisotropic film 7 was manufactured. It was confirmed that the composition 7 for forming an optically anisotropic film exhibits the lyotropic liquid crystallinity in the heating process.

The slow axis direction of the manufactured optically anisotropic film 7 was orthogonal to the rubbing direction. In a case where the optical characteristics of the optically anisotropic film 7 were measured, Re(550) was 130 nm, Re(450)/Re(550) was 0.82, and Re(650)/Re(550) was 1.06. Rth(550) was −11 nm.

The optically anisotropic film 7 exhibited reverse wavelength dispersibility and satisfied the relationship of nx>nz>ny.

Comparative Example 1

(Manufacture of Optically Anisotropic Film C1)

A composition 3 for forming an optically anisotropic film having the following composition was prepared. The composition C1 for forming an optically anisotropic film was a composition exhibiting lyotropic liquid crystallinity.

A comparative low molecule 1 had a maximal absorption wavelength at 320 nm in the wavelength range of 250 to 700 nm.

| Composition C1 for forming optically anisotropic film | |
|---|---|
| Comparative low molecule 1 | 70 parts by mass |
| Rod-like compound 3-1 | 30 parts by mass |
| Water | 900 parts by mass |

Comparative low molecule 1

A surface of the coating film of the substrate manufactured in Example 1, on which the coating film was formed on the surface, was subjected to a rubbing treatment so that a rubbing direction was 45° with respect to a longitudinal direction of the substrate.

Next, the composition 3 for forming an optically anisotropic film prepared above was applied onto the rubbing-treated surface. Next, the obtained substrate was heat-aged at a film surface temperature of 60° C. for 60 seconds and cooled to room temperature to fix the alignment state, whereby an optically anisotropic film C1 was manufactured.

The slow axis direction of the manufactured optically anisotropic film C1 was orthogonal to the rubbing direction. In a case where the optical characteristics of the optically anisotropic film C1 were measured, Re(550) was 155 nm, Re(450)/Re(550) was 1.06, and Re(650)/Re(550) was 0.95. Rth(550) was −20 nm. In addition, the optically anisotropic film C1 satisfied the relationship of nx>nz>ny.

The optically anisotropic film C1 did not show reverse wavelength dispersibility.

Comparative Example 2

(Manufacture of Optically Anisotropic Film C2)

A composition C2 for forming an optically anisotropic film having the following composition was prepared. The composition C2 for forming an optically anisotropic film was a composition exhibiting lyotropic liquid crystallinity.

A comparative high molecule 1 had a maximal absorption wavelength at 315 nm in the wavelength range of 250 to 700 nm.

| Composition C2 for forming optically anisotropic film | |
| --- | --- |
| Specific compound 1-2 | 70 parts by mass |
| Comparative high molecule 1 | 30 parts by mass |
| Water | 900 parts by mass |

Comparative high molecule 1

A surface of the coating film of the substrate manufactured in Example 1, on which the coating film was formed on the surface, was subjected to a rubbing treatment so that a rubbing direction was 45° with respect to a longitudinal direction of the substrate. The composition 4 for forming an optically anisotropic film prepared above was applied onto the rubbing-treated surface. Next, the obtained substrate was heat-aged at a film surface temperature of 60° C. for 60 seconds and cooled to room temperature to fix the alignment state, whereby an optically anisotropic film C2 was manufactured.

The slow axis direction of the manufactured optically anisotropic film C2 was orthogonal to the rubbing direction. In a case where the optical characteristics of the optically anisotropic film C2 were measured, Re(550) was 150 nm, Re(450)/Re(550) was 1.05, and Re(650)/Re(550) was 0.96. Rth(550) was −20 nm. In addition, the optically anisotropic film C2 satisfied the relationship of nx>nz>ny.

The optically anisotropic film C2 did not show reverse wavelength dispersibility.

EXPLANATION OF REFERENCES

10: substrate
12: rod-like compound
14: specific compound

What is claimed is:
1. A composition comprising:
a compound represented by Formula (1); and
a rod-like compound,
wherein the compound represented by Formula (1) has a maximal absorption wavelength in a wavelength range of 300 nm or less, and
wherein the rod-like compound has a maximal absorption wavelength in a wavelength range of 330 nm or more, in the formula, $Ar_{11}$ and $Ar_{12}$ each independently represent a monovalent aromatic ring which may have a substituent, $Z_{11}$, $Z_{12}$, and $Z_{13}$ each independently represent a single bond, —NH—, or —O—, $Y_{11}$, $Y_{12}$, and $Y_{13}$ each independently represent —CH= or —N=, and L represents a divalent linking group, the rod-like compound contains at least one selected from the group consisting of a polymer having a repeating unit represented by Formula (2) and a polymer having a repeating unit represented by Formula (3), in the formula, $Ar_{21}$, $Ar_{22}$, and $Ar_{23}$ each independently represent a divalent aromatic ring which may have a substituent, R represents a hydrogen atom or a substituent, $X_2$ represents a single bond or a divalent linking group, $m_2$ represents an integer from 0 to 3, and in a case where $m_2$ is 2 or more, a plurality of $X_2$'s and a plurality of $Ar_{23}$'s may be the same as or different from each other, respectively, and in the formula, $Ar_{31}$ represents a tetravalent aromatic ring which may have a substituent, $Ar_{32}$ and $Ar_{33}$ each independently represent a divalent aromatic ring which may have a substituent, $X_3$ represents a single bond or a divalent linking group, $m_3$ represents an integer from 0 to 3, and in a case where $m_3$ is 2 or more, a plurality of $X_3$'s and a plurality of $Ar_{33}$'s may be the same as or different from each other, respectively.

2. The composition according to claim 1,
wherein at least one of the compound represented by Formula (1) or the rod-like compound has a polymerizable group.

3. The composition according to claim 1,
wherein a content of the compound represented by Formula (1) with respect to total mass of the compound represented by Formula (1) and the rod-like compound is more than 50% by mass.

4. The composition according to claim 1, further comprising:
a near infrared absorbing compound having a maximal absorption wavelength in a wavelength range of 700 to 1,000 nm.

5. The composition according to claim 1, further comprising:
a polymerizable monomer.

6. The composition according to claim 1, further comprising:
a compound represented by Formula (4), (4)

in the formula, $W_1$ and $W_2$ each independently represent a hydrogen atom, an alkyl group having 1 to 30 carbon atoms, a sulfonic acid group or a salt thereof, a phosphonic acid group or a salt thereof, or a polymerizable group, R represents a hydrogen atom or a methyl group, and n represents the number of repeating units.

7. The composition according to claim 1, further comprising:
a solvent.

8. An optically anisotropic film formed of the composition according to claim 1.

9. An optical film comprising:
a substrate; and
the optically anisotropic film according to claim 8.

10. The optical film according to claim 9, further comprising:
an alignment film arranged between the substrate and the optically anisotropic film.

11. A circularly polarizing plate comprising:
the optically anisotropic film according to claim 8; and
a polarizer.

12. The circularly polarizing plate according to claim 11,
wherein an angle formed by a slow axis of the optically anisotropic film or a slow axis of the optically anisotropic film in the optical film and an absorption axis of the polarizer is within a range of 45°±5°.

13. An organic electroluminescent display device comprising:
an organic electroluminescence display element having a substrate, a metal electrode layer, a light emitting layer consisting of an organic material, and a transparent electrode layer; and
a circularly polarizing plate,
wherein the circularly polarizing plate comprises an optically anisotropic film and a polarizer,
the optically anisotropic film is formed of a composition comprising:
a compound represented by Formula (1); and
a rod-like compound,
wherein the compound represented by Formula (1) has a maximal absorption wavelength in a wavelength range of 300 nm or less, and
the rod-like compound has a maximal absorption wavelength in a wavelength range of 330 nm or more, (1)

in the formula, $Ar_{11}$ and $Ar_{12}$ each independently represent a monovalent aromatic ring which may have a substituent, $Z_{11}$, $Z_{12}$, and $Z_{13}$ each independently represent a single bond, —NH—, or —O—, $Y_{11}$, $Y_{12}$, and $Y_{13}$ each independently represent —CH= or —N=, and L represents a divalent linking group,
wherein the optically anisotropic film in the circularly polarizing plate is arranged closer to the organic electroluminescence display element than the polarizer, and
a total value of a thickness-direction retardation of all members existing between the metal electrode layer and the polarizer at a wavelength of 550 nm is within 0±30 nm.

14. A circularly polarizing plate comprising:
the optical film according to claim 9; and
a polarizer.

* * * * *